United States Patent
Roest et al.

(10) Patent No.: US 9,590,027 B2
(45) Date of Patent: Mar. 7, 2017

(54) METHOD FOR FABRICATING AN INTEGRATED-PASSIVES DEVICE WITH A MIM CAPACITOR AND A HIGH-ACCURACY RESISTOR ON TOP

(75) Inventors: Aarnoud Laurens Roest, Geldrop (NL); Linda Van Leuken-Peters, Maarheeze (NL)

(73) Assignee: NXP B.V., Eindhoven (NL)

(*) Notice: Subject to any disclaimer, the term of this patent is extended or adjusted under 35 U.S.C. 154(b) by 543 days.

(21) Appl. No.: 13/264,816

(22) PCT Filed: Apr. 14, 2010

(86) PCT No.: PCT/IB2010/051612
§ 371 (c)(1),
(2), (4) Date: Oct. 17, 2011

(87) PCT Pub. No.: WO2010/122454
PCT Pub. Date: Oct. 28, 2010

(65) Prior Publication Data
US 2012/0045881 A1    Feb. 23, 2012

(30) Foreign Application Priority Data
Apr. 20, 2009  (EP) .................................. 09158242

(51) Int. Cl.
*H01L 21/20* (2006.01)
*H01L 49/02* (2006.01)
(Continued)

(52) U.S. Cl.
CPC ............ *H01L 28/55* (2013.01); *H01L 27/016* (2013.01); *H01L 28/20* (2013.01); *H01L 28/65* (2013.01);
(Continued)

(58) Field of Classification Search
USPC ................... 257/E21.008, E21.011; 438/396
See application file for complete search history.

(56) References Cited

U.S. PATENT DOCUMENTS 5,920,453 A * 7/1999 Evans et al. ................... 361/303
6,281,535 B1 * 8/2001 Ma et al. ....................... 257/295
(Continued)

FOREIGN PATENT DOCUMENTS

WO    2008/028660 A2    3/2008

OTHER PUBLICATIONS

Search Report and Written Opinion for International Patent Application PCT/IB2010/051612 (Jul. 2, 2010).

*Primary Examiner* — Robert Huber
(74) *Attorney, Agent, or Firm* — Rajeev Madnawat

(57) ABSTRACT

The present invention relates to a method for fabricating an electronic component, comprising fabricating, on a substrate (102) at least one integrated MIM capacitor (114) having a top capacitor electrode (118) and a bottom capacitor electrode (112) at a smaller distance from the substrate than the top capacitor electrode; fabricating an electrically insulating first cover layer (120) on the top capacitor electrode, which first cover layer partly or fully covers the top capacitor electrode and is made of a lead-containing dielectric material; thinning the first cover layer; fabricating an electrically insulating second cover layer (124) on the first cover layer, which second cover layer partly or fully covers the first cover layer and has a dielectric permittivity smaller than that of the first cover layer; and fabricating an electrically conductive resistor layer (126) on the second cover layer, which resistor layer has a defined ohmic resistance.

20 Claims, 2 Drawing Sheets

(51) Int. Cl.
    *H01L 27/01*    (2006.01)
    *H01L 27/02*    (2006.01)
    *H01L 27/06*    (2006.01)

(52) U.S. Cl.
    CPC ...... *H01L 27/0251* (2013.01); *H01L 27/0688* (2013.01)

(56) References Cited

U.S. PATENT DOCUMENTS

| | | | |
|---|---|---|---|
| 6,384,440 B1* | 5/2002 | Mori et al. | 257/296 |
| 2002/0175361 A1 | 11/2002 | Fox et al. | |
| 2003/0030125 A1* | 2/2003 | Goldberger et al. | 257/532 |
| 2004/0197987 A1 | 10/2004 | Waki et al. | |
| 2006/0214208 A1 | 9/2006 | Wang | |
| 2008/0001292 A1 | 1/2008 | Zelner et al. | |
| 2011/0204480 A1* | 8/2011 | Roest et al. | 257/532 |

\* cited by examiner

US 9,590,027 B2

METHOD FOR FABRICATING AN INTEGRATED-PASSIVES DEVICE WITH A MIM CAPACITOR AND A HIGH-ACCURACY RESISTOR ON TOP

FIELD OF THE INVENTION

The present invention relates to a method for fabricating an electronic component and for fabricating an electronic device.

BACKGROUND OF THE INVENTION

MIM (metal-insulator-metal) capacitors based on high-K dielectrics play an important role for next generation Integrated Discretes (IDs) devices. Such Integrated Discretes devices comprise for instance capacitors, resistors and ESD protection diodes.

US 2008/0001292 A1 describes an electronic component with an integrated thin-film MIM capacitor structure on a substrate. The thin-film capacitor includes a pyrochlore or perovskite alkali earth dielectric layer between a plurality of electrode layers. A pyrochlore or perovskite hydrogen-gettering cover layer is deposited over the thin-film capacitor. It is in different embodiments made of $(Ba_x Sr_y)TiO_3$ (BST), $BaTiO_3$, $CaTiO_3$, $SrTiO_3$, $BeTiO_3$, $MbTiO_3$ or a mix of these materials. The hydrogen-gettering cover layer prevents hydrogen from reacting with and degrading the properties of the dielectric material. A hermetic seal layer is then deposited over the cover layer by a hydrogen-producing method, without causing damage to the dielectric layer.

It is briefly mentioned in US 2008/0001292 A1 that other passive components such as inductors, resistors and capacitors can be integrated into the electronic component on the same substrate.

For saving chip area, it would be desirable to provide an electronic component with a three-dimensional arrangement of capacitors on one hand and resistors and/or inductors on the other hand, and optionally with other active or passive circuit elements, i.e., stacked on top of each other.

It would also be desirable to be able to provide such a three-dimensional arrangement when using cover layers made of different materials than those known from US 2008/0001292 A1. In particular, using a lead-containing cover layer raises difficulties. Issues of process reliability have been observed when using a dielectric layers as a cover layer in a stacked arrangement of passives comprising a capacitor and a resistor on top of the capacitor. The difficulties arise in particular in a desired precise control of the electrical resistance of a resistor layer during manufacture of the device.

SUMMARY OF THE INVENTION

According to the present invention, a method for fabricating an electronic component is provided. The method comprises:

fabricating, on a substrate, at least one integrated MIM capacitor having a top capacitor electrode, and a bottom capacitor electrode at a smaller distance from the substrate than the top capacitor electrode;

fabricating an electrically insulating first cover layer on the top capacitor electrode, which first cover layer partly or fully covers the top capacitor electrode and is made of a lead-containing dielectric material;

thinning the first cover layer;

fabricating an electrically insulating second cover layer on the first cover layer, which second cover layer partly or fully covers the first cover layer and has a dielectric permittivity smaller than that of the first cover layer; and fabricating an electrically conductive resistor layer on the second cover layer, which resistor layer has a defined ohmic resistance.

With the method of the present invention the fabrication of a highly reliable resistor layer on top of an integrated MIM capacitor on a substrate is achieved, that means, the resistor layer can be fabricated to precisely assume a desired electrical resistance. By employing the method of the present invention, the electrical-resistance value of the resistor layer on top of the MIM capacitor is not any more influenced in an uncontrollable manner, as has been observed when employing prior-art fabrication methods. The improved reliability achieved with the method of the present invention is to be understood in the sense that it allows achieving a high accuracy of the electrical resistance for a large number of electronic components fabricated concurrently on a single wafer, and in different processing runs, thus improving the fabrication efficiency and lowering the overall processing cost of the electronic component.

The method of the invention is based on the recognition that the lead-containing first cover layer is effectively prevented from developing deteriorating effects on the subsequent fabrication of the second cover layer exerted by Pb particles on the surface of the first cover layer formed during the deposition of the second cover layer. Such Pb particles have been found to originate from reduced oxidized Pb species from the lead-containing first cover layer. By thinning the first cover layer, most of the disturbing Pb particles are removed from the top surface of the lead-containing first cover layer. The thinning of the first cover layer leads to a more than proportional removal of the lead. Due to this effect the top of the remaining first cover layer is lead poor. This suppresses a catalytic growth mechanism of nanostructures during the initial growth stages of the fabrication of the second cover layer, which would result in a strong surface roughness of the second cover layer, which intern would negatively affect the structure and reliability of the resistor layer.

The method of the present invention is particularly useful in the fabrication of integrated high-K MIM capacitors.

In the following, embodiments of the method of the invention will be described. It shall be understood that the additional features of respective embodiments can be combined to form additional embodiments, unless such embodiments are disclosed as mutually exclusive or as forming alternatives to each other.

While the application of the method of the present invention is not restricted to the field of fabricating electronic components with high-K MIM capacitors, they do form a preferred field of application. High-K MIM capacitors are very advantageous for operation under voltages even higher than 10 V. The method of the invention allows improving the advantageous combination of such high-K MIM capacitors with resistors in a stacked arrangement. The term high-K capacitor as used herein refers to capacitors with a high-K capacitor dielectric between the top and bottom electrodes. Such high-K MIM capacitor dielectrics may for instance have a relative dielectric permittivity of between 100 and 5000. Such high values of the relative dielectric permittivity are for instance achieved by magnesium-doped lead niobate, lead titanate, i.e., PMNPT, or lead zirconate titanate i.e., PZT, which may or may not be doped. MIM capacitors based on such high-K materials can be used to obtain capacitance densities up to 100 nF/mm$^2$.

The relative dielectric permittivity as a material parameter is in the art synonymously also referred to as the relative static permittivity, or, in short, as the dielectric constant and often represented by the letter K or by $\in_r$.

For embodiments having a lead-containing capacitor dielectric, the lead-containing first cover layer provides a particular advantage in that the capacitor dielectric achieves a very high dielectric constant, which would in absence of the lead-containing first cover layer be negatively affected and thus be much lower. Using for instance lead-containing perovskite dielectrics, like PZT for both the capacitor dielectric and for the first cover layer allows achieving a capacitor dielectric with a dielectric constant of up to 1700. Also, the breakdown voltage of the MIM capacitor can be made particularly high, depending, of course, on the thickness of the capacitor dielectric. The lead-containing first cover layer achieves this advantage of a high dielectric constant and a high breakdown voltage also for other lead-containing dielectric materials, such as PLZT or PNMPT.

The lead-containing first cover layer, however, may also be used in absence of a lead-containing capacitor dielectric, and also in presence of a capacitor dielectric having a low dielectric constant, i.e., lower than 100. In combination with the second cover layer that has a lower dielectric constant, preferably in a range below 10, the close arrangement of the resistor layer and the top capacitor electrode can achieved a small parasitic capacitance value. The second cover layer is in preferred embodiments of the method of the invention made of materials having a dielectric constant in a range of up to only 7, such as a silicon nitride (e.g., $Si_3N_4$), a silicon oxide, such as $SiO_2$, a silicon oxynitride, or of one of these materials additionally containing hydrogen or organic residues. Of course, a combination of a plurality of the mentioned materials is also possible for the fabrication of the second cover layer. This may for instance take the form of depositing a laminate structure.

The second cover layer is typically fabricated with a higher thickness than the first cover layer in order to achieve a desired low effective dielectric constant of the complete cover layer structure between the MIM capacitor and the resistor layer. The first cover layer may for instance be fabricated with a thickness of between 90 and 300 nm, after the thinning.

The thinning is preferably performed to remove between 10 and 50 nm of the first cover layer. Removing this surface section of the first cover layer effectively avoids the creation of Pb particles originating from reduction processes of lead oxide, which is reduced to Pb particles during the deposition of the second cover layer. Thinning leads to a lead-poor surface of the first cover layer. In other words, the thinning will predominantly remove such Pb particles from the surface of the first cover layer.

The thinning of the first cover layer may be performed by different methods. In one embodiment, the thinning of the first cover layer comprises sputtering the first cover layer back.

In an alternative embodiment, etching the first cover layer back is performed by thinning the first cover layer. Etching may for instance be performed as a wet etch process. Suitable etching agents are $HNO_3$ or HCl, preferably applied in a solution.

A preferred embodiment of the method of the invention involves fabricating a bottom barrier layer of a dielectric material between the substrate and the bottom electrode. The bottom barrier layer, much like the first cover layer, serves to achieve a particularly high dielectric constant of the lead-containing capacitor dielectric, e. g. PZT, PLZT, or PMNPT.

The fabrication of the top and bottom capacitor electrodes preferably comprises using identical materials. A suitable material for both electrodes is platinum.

Fabricating the resistor layer comprises, in one advantageous embodiment, depositing at least one element of the group of Mo, Ni, Cr, Ti, Si or W. The resistor layer may also be made from a semi conducting material. In the resistor layer, an interconnect layer can be deposited directly, providing connectivity to integrated circuitry that may be provided in the electronic component on the same substrate, or on another substrate to be connected by known means, such as flip-chip arrangement, a system-in-package, etc.

The resistor layer can in some part of it be arranged in direct connection to the top electrode of the capacitor. In other parts it may be arranged on top of the second cover layer. In some embodiments, the resistor layer may be fabricated to form an inductor with an inductance of a desired value.

The interconnect layer can for instance be an aluminum or Al(Cu) layer. However, any other material known for use in interconnect structures can be used as an alternative.

The electronic component of the present invention or any of its embodiments disclosed herein is advantageously integrated with at least one active semiconductor element like a diode or a transistor, formed in the same substrate. This way, an electronic device with integrated active and passive circuit elements on the same substrate is fabricated. A particularly high integration density can be obtained for such an electronic device, since the electronic component has the resistors arranged on top of the MIM capacitors, thus allowing considerable savings of chip area.

An advantageous application case of the method of the present invention or any of its embodiments disclosed herein is the fabrication of an integrated ESD protection device, i.e., a device protecting electronic circuitry against electrostatic discharge. The ESD protection device has at least one ESD protection diode arranged in the substrate, on which the electronic component is fabricated. The ESD protection device can be integrated with other electronic circuitry on the same substrate, to form an integrated, ESD protected electronic device.

Preferred embodiments of the invention are defined in the dependent claims.

DETAILED DESCRIPTION OF THE INVENTION

The present invention is further elucidated by the following figures and examples, which are not intended to limit the scope of the invention. The person skilled in the art will understand that various embodiments may be combined.

BRIEF DESCRIPTION OF THE DRAWINGS

These and other aspects of the invention will be apparent from and elucidated with reference to the embodiment(s) described hereinafter. In the following drawings.

DETAILED DESCRIPTION OF THE DRAWINGS

Figure 1:
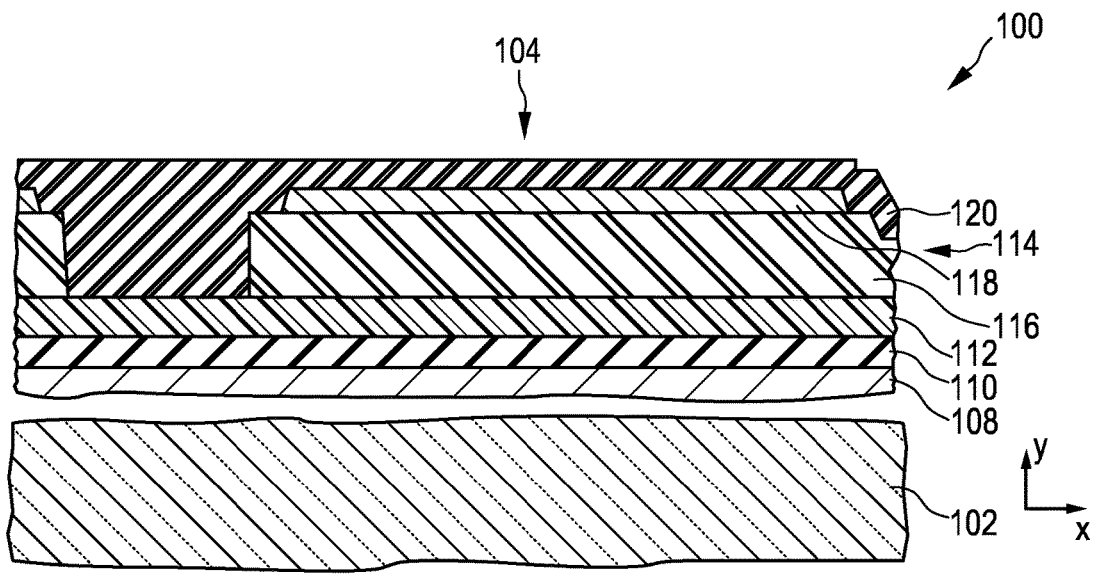
FIG. 1 shows a schematic cross-sectional view of an electronic component at a first processing stage of a method according to the present invention.

FIG. 1 shows a schematic cross-sectional view of an electronic component 104 on a substrate 102. Only selected portions of the electronic component are shown in order to focus the present description on parts of relevance of the present invention.

Only an upper section of the substrate 102 is shown. In this region, the substrate is made of silicon, as used abundantly in the semiconductor industry. However, other substrate materials, such as GaAs, GaN, SiC or SiGe can be used here as an alternative, if suitable. Structured substrate such as silicon-on-insulator (SOI) may also be used according to the requirements of a particular application.

Figure 2:
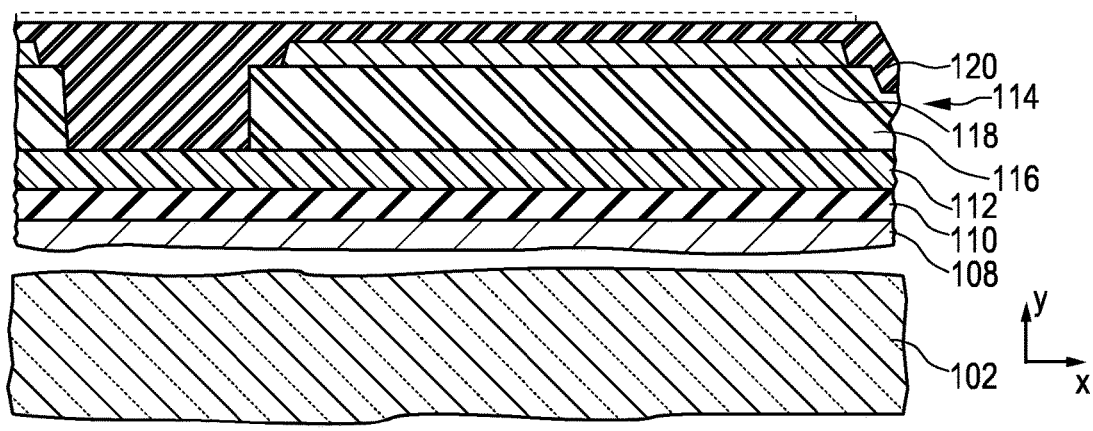
FIG. 2 shows the electronic component of FIG. 1 at a second processing stage.
Figure 3:
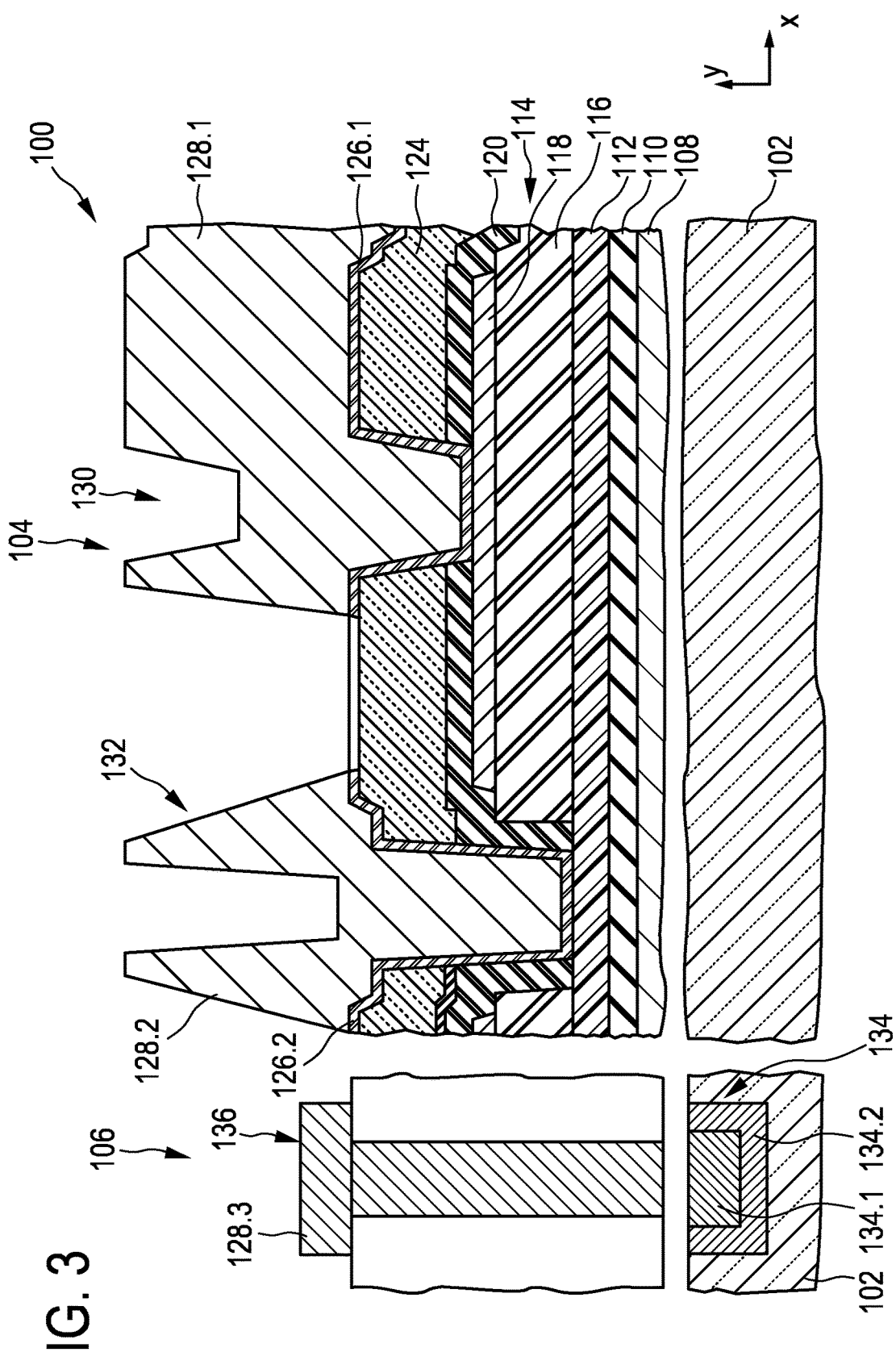
FIG. 3 shows the electronic component of FIGS. 1 and 2 at a third processing stage, integrated into an electronic device.

Graphical details corresponding to structural elements arranged in a vertical direction y between the substrate 102 and the electronic component 104 are omitted in FIGS. 1 to 3 for reasons of simplicity of the present description. Active or passive circuit components may be arranged there, as suitable for a respective application case.

The structural detail of the electronic component 104 at the processing stage shown in FIG. 1 begins with a titanium oxide ($TiO_2$) layer 108, followed by a bottom barrier layer 110 made of a high-K dielectric material, such as PZT. On the bottom barrier layer, a bottom electrode 112 of a high-K MIM capacitor is deposited. A suitable electrode material is platinum. A capacitor dielectric 116 is deposited on the bottom electrode 112 with a smaller lateral extension than the bottom electrode, in a lateral direction of the paper plane, indicated by x in FIG. 1. The capacitor dielectric of the present embodiment is made of a high-K dielectric having a dielectric constant larger than 100. For achieving a particularly high capacitance density (capacitance per area) PZT, PLZT or PMNPT are suitable dielectric materials. The capacitor dielectric 116 is deposited with a thickness chosen according to the needs of a particular application. An example is a thickness of 400 nm. However, lower or higher values can be chosen.

On top of the capacitor dielectric 116, a top electrode 118 of the MIM capacitor 114 is deposited. The top electrode is in the present embodiment made of the same material as the bottom electrode. The capacitor structure 114 is subsequently covered by a first cover layer 120. The first cover layer 120 is deposited with a thickness in the range between 30 and 350 nm.

The first cover layer 120 is made of lead-containing material, PZT in the present embodiment. The first cover layer, like the bottom barrier layer 110, helps achieving a particularly high dielectric constant of the capacitor dielectric 116. Using PZT as the capacitor dielectric in combination with the first cover layer, a dielectric constant of up to 1700 can be achieved, so that with the mentioned exemplary thickness of the capacitor dielectric of 400 nm, a capacitance density of 30 $nF/mm^2$ can be achieved. At the same time, a breakdown voltage of the high-K capacitor as high as 150 V can be obtained by fabricating this structure shown in FIG. 1.

If a resistor layer were hypothetically directly deposited on this first cover layer 120, a well-controlled and thus high-accuracy resistor could be achieved. However, due to the high dielectric constant of the first cover layer 120, an undesired large parasitic capacitance would be created in the lateral range of the high-K MIM capacitor 114. Therefore, a second cover layer 124 with a low dielectric constant is to be deposited on the first cover layer 120. However, according to experiments made by the inventors, the formation of the second cover layer 124 would lead to very poor results in a subsequent fabrication of a resistor layer if the method of the invention were not used. The second cover layer 124 would have a particularly large roughness on its top surface, which in turn prevents the fabrication of a highly accurate resistor on top of the second cover layer 124. The inventors found that the roughness is caused by the fact that a fraction of lead ions of the (in case of PZT, PLZT or PMNPT: perovskite) lattice of the first cover layer 120 is reduced under reducing processing conditions, in particular under hydrogen-rich deposition conditions that are normally used to deposit materials for the second cover layer, such as silicon nitride, silicon oxide, or silicon oxynitride. Hydrogen, as an example of a reducing agent, may not only affect outer regions of the first cover layer 120, but also penetrate into the first cover layer 120. Nucleation sites for nanoparticle growth are observed to form under these conditions, which results, for instance, in a nanowire growth of the material of the second cover layer 124, probably via a VLS (vapor-liquid-solid) mechanism. This in turn results in a rough surface of the second cover layer 124 to be deposited, which prevents the realization of high-accuracy thin-film resistors.

In order to achieve a high accuracy resistor in the presence of the lead-containing first cover layer 120, the lead-containing cover layer 120 is thinned by approximately 10 to 40 nm in a subsequent processing step. The result of this processing step is shown in FIG. 2. In FIG. 2, the as-deposited thickness of the first cover layer 120 is indicated by dashed lines. The thickness of the first cover layer after the thinning step is indicated by the full line at the top surface of the first cover layer 120. The thinning step may be performed by back sputtering. As an alternative, an etching process may be used. The etching process is suitably a wet-etch process, and for instance uses $HNO_3$ or HCl as etching agents.

By virtue of this thinning step, most of the Pb from the top face of the first cover layer is removed, and a catalytic growth of nanoparticles supported by the Pb is suppressed. Instead, the growth of the second cover layer starts smoothly and results in an overall smooth second cover layer. A suitable material of the second cover layer is SiN, silicon oxide, or silicon oxinitride. An alternative material is spin-on-glass (SOG).

FIG. 3 shows a schematic cross-sectional view of the electronic component 104 at a later processing stage, and as integrated into an electronic device 100. At this stage, the second cover layer 124 has been deposited on the thinned first cover layer 120. Subsequently, a resistor layer 126 has been deposited. The resistor layer 126 has different sections 126.1 and 126.2, which form individual resistors. The resistor layer 126 is in the present embodiment made of at least one element of the group of Mo, Ni, Cr, Ti, Si or W. The resistor layer has been deposited after patterning the cover-layer structure of the first and second cover layers 120 and 124. The patterning allows forming the resistor layer 126 partly in direct contact with the capacitor electrode 118, in openings of the cover-layer structure. This way, a direct contact is also established between the bottom electrode 112 and the resistor 126.2.

On the resistor layer 126, an interconnect material such as Al(Cu) has been fabricated and laterally patterned to form contacts or interconnects 130 and 132 to the top and bottom electrodes 118 and 112, respectively.

Furthermore, in an active section 106 of the electronic device 100, a diode 134 has been formed in the substrate at any time during the front-end processing. The diode 134 is schematically indicated by doped substrate regions 134.1 and 134.2 of opposite conductivity type in the substrate. The diode 134 is contacted via an interconnect 136.

The electronic device 100 fabricated this way can be applied in different fields. Particularly advantageous applications are in the field of radio frequency devices and ESD protection devices.

While the invention has been illustrated and described in detail in the drawings and foregoing description, such illustration and description are to be considered illustrative or exemplary and not restrictive; the invention is not limited to the disclosed embodiments. The terms "top" and "bottom" as used herein, only serve to differentiate structural element with respect to their distance from the substrate. A "bottom" structural element is closer to the substrate than a "top" structural element. The terms are not used to imply an orientation in space of the electronic component or device.

Other variations to the disclosed embodiments can be understood and effected by those skilled in the art in practicing the claimed invention, from a study of the drawings, the disclosure, and the appended claims.

In the claims, the word "comprising" does not exclude other elements or steps, and the indefinite article "a" or "an" does not exclude a plurality. The mere fact that certain measures are recited in mutually different dependent claims does not indicate that a combination of these measured cannot be used to advantage.

Any reference signs in the claims should not be construed as limiting the scope.

The invention claimed is:

1. A method for fabricating an electronic component, the method comprising:
    fabricating, on a substrate, at least one integrated MIM capacitor having a top capacitor electrode, and a bottom capacitor electrode at a smaller distance from the substrate than the top capacitor electrode;
    fabricating an electrically insulating first cover layer on the top capacitor electrode, wherein the first cover layer at least partly covers the top capacitor electrode and includes a lead-containing dielectric material;
    thinning the first cover layer, wherein the thinning step removes a more than proportional amount of lead from the lead-containing dielectric material such that the lead-containing dielectric material has a lower concentration of lead after the thinning step than before the thinning step;
    fabricating an electrically insulating second cover layer on the first cover layer, wherein the second cover layer at least partly covers the first cover layer and has a dielectric permittivity smaller than that of the first cover layer; and
    fabricating an electrically conductive resistor layer on the second cover layer, wherein the resistor layer has a defined ohmic resistance.

2. The method of claim 1, wherein thinning the first cover layer comprises:
    sputtering the first cover layer back.

3. The method of claim 1, wherein thinning the first cover layer comprises:
    etching the first cover layer back.

4. The method of claim 1, wherein thinning the first cover layer comprises:
    removing between 10 and 50 nanometers of the first cover layer.

5. The method of claim 1, wherein the first cover layer includes lead zirconate titanate (PZT).

6. The method of claim 1, wherein the first cover layer has a thickness of between 30 and 300 nm after the thinning step.

7. The method of claim 1, wherein the resistor layer is made of at least one element from a group of Mo, Ni, Cr, Ti, Si, and W.

8. The method of claim 1, wherein fabricating the MIM capacitor comprises:
    fabricating a dielectric layer of the MIM capacitor, wherein the dielectric layer has a relative dielectric permittivity of between 100 and 5000.

9. The method of claim 1, wherein the second cover layer is made of silicon nitride.

10. The method of claim 1, further comprising:
    fabricating a bottom barrier layer of a dielectric material between the substrate and the bottom capacitor electrode.

11. The method of claim 1, further comprising:
    fabricating a direct connection of the resistor layer with the top capacitor electrode.

12. The method of claim 1, further comprising:
    fabricating at least one active semiconductor element on an identical substrate.

13. The method of claim 12, wherein the at least one active semiconductor element is an ESD protection diode.

14. The method of claim 1, wherein a top portion of the first cover layer has a lower concentration of lead after the thinning step than before the thinning step.

15. The method of claim 1, wherein the second cover layer is fabricated with a higher thickness than the first cover layer.

16. The method of claim 1, wherein an interconnect layer is deposited directly upon the resistor layer.

17. The method of claim 1, wherein the resistor layer is fabricated to form an inductor with an inductance of a desired value.

18. The method of claim 1, wherein the second cover layer is made of silicon oxynitride.

19. The method of claim 1, wherein the second cover layer is made of spin-on-glass (SOG).

20. The method of claim 10, wherein the bottom barrier layer includes lead zirconate titanate (PZT).

* * * * *